(12) United States Patent
Enyama et al.

(10) Patent No.: US 11,915,903 B2
(45) Date of Patent: Feb. 27, 2024

(54) ELECTRON BEAM APPLICATION APPARATUS

(71) Applicant: Hitachi High-Tech Corporation, Tokyo (JP)

(72) Inventors: Momoyo Enyama, Tokyo (JP); Akira Ikegami, Tokyo (JP); Takeshi Morimoto, Tokyo (JP); Yasuhiro Shirasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 84 days.

(21) Appl. No.: 17/676,386

(22) Filed: Feb. 21, 2022

(65) Prior Publication Data

US 2022/0319798 A1 Oct. 6, 2022

(30) Foreign Application Priority Data

Mar. 31, 2021 (JP) ................................. 2021-059982

(51) Int. Cl.
*H01J 37/153* (2006.01)
*H01J 37/14* (2006.01)
(Continued)

(52) U.S. Cl.
CPC ............ *H01J 37/153* (2013.01); *H01J 37/14* (2013.01); *H01J 37/147* (2013.01); *H01J 37/28* (2013.01);
(Continued)

(58) Field of Classification Search
CPC .......... H01J 37/00; H01J 37/02; H01J 37/153; H01J 37/14; H01J 37/147; H01J 37/28; H01J 37/26; H01J 37/285; H01J 2237/141; H01J 2237/1534; H01J 2237/0492; H01J 2237/1523; H01J 2237/2811; H01J 2237/2855
(Continued)

(56) References Cited

U.S. PATENT DOCUMENTS

| 2004/0036031 A1* | 2/2004 | Rose ..................... H01J 37/153 |
| | | 250/396 R |
| 2007/0200070 A1 | 8/2007 | Tromp | |
| 2009/0134339 A1* | 5/2009 | Uhlemann ............ H01J 37/153 |
| | | 250/396 R |

FOREIGN PATENT DOCUMENTS

| JP | 2009528668 A | 8/2009 |
| JP | 2020085873 A | 6/2020 |

* cited by examiner

*Primary Examiner* — Jason L McCormack
(74) *Attorney, Agent, or Firm* — Miles & Stockbridge, P.C.

(57) ABSTRACT

Provided is a projection electron beam application apparatus suitable for use in semiconductor manufacturing lines. An electron optical system of the electron beam application apparatus includes a mirror aberration corrector 106 disposed perpendicular to an optical axis 109, a plurality of magnetic field sectors 104 by which an orbit of electrons is deviated from the optical axis to make the electrons incident on the mirror aberration corrector 106, and the orbit of the electrons emitted from the mirror aberration corrector 106 is returned to the optical axis, and a doublet lens 105 disposed between adjacent magnetic field sectors along the orbit of the electrons. The plurality of magnetic field sectors have the same deflection angle for deflecting the orbit of the electrons, and the doublet lens is disposed such that an object plane and an image plane thereof are respectively central planes of the adjacent magnetic field sectors along the orbit of the electrons.

14 Claims, 7 Drawing Sheets

(51) Int. Cl.
*H01J 37/147* (2006.01)
*H01J 37/28* (2006.01)
(52) U.S. Cl.
CPC . *H01J 2237/141* (2013.01); *H01J 2237/1534* (2013.01)
(58) Field of Classification Search
USPC .............. 250/306, 307, 311, 396 R, 396 ML
See application file for complete search history.

[FIG. 1]
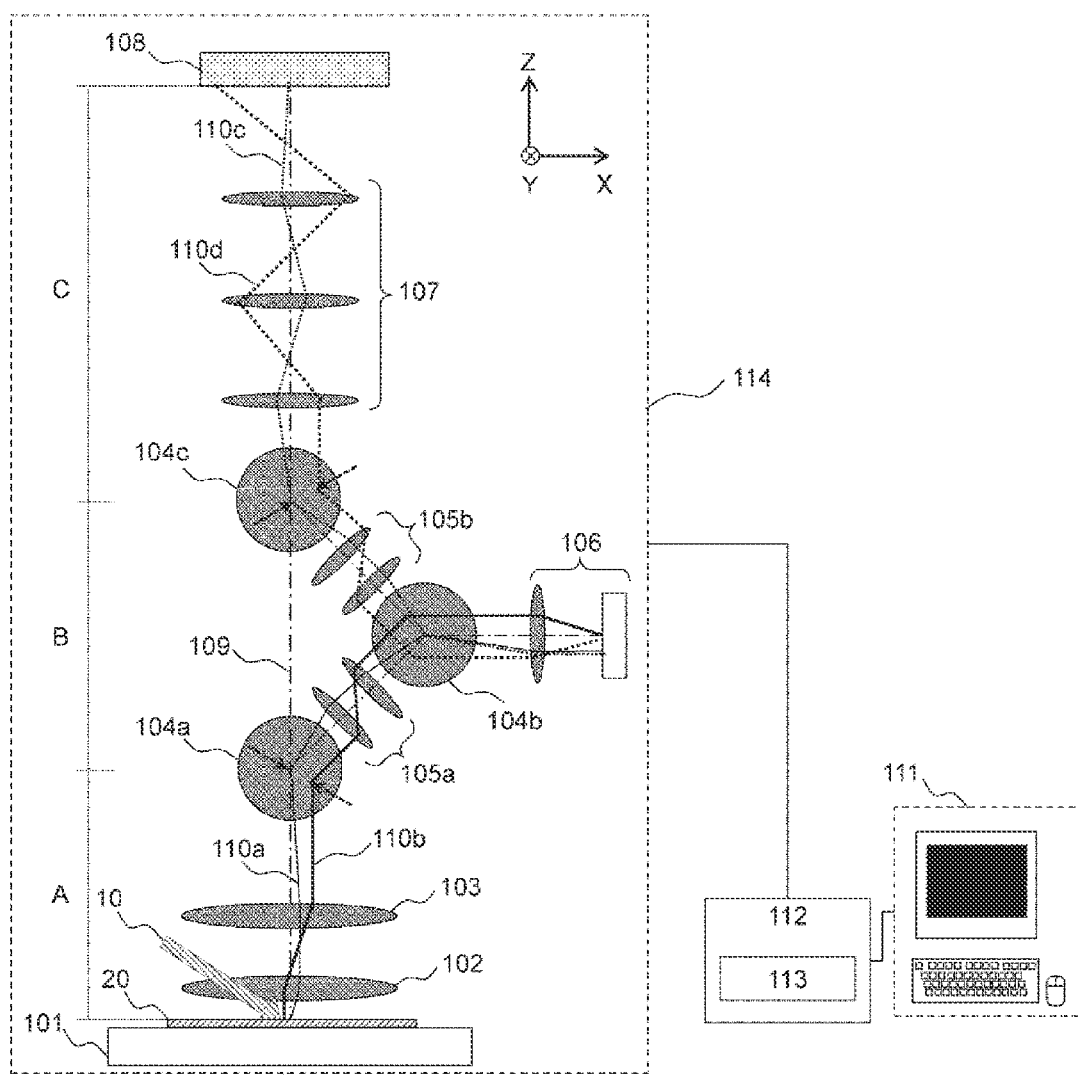

[FIG. 2A]
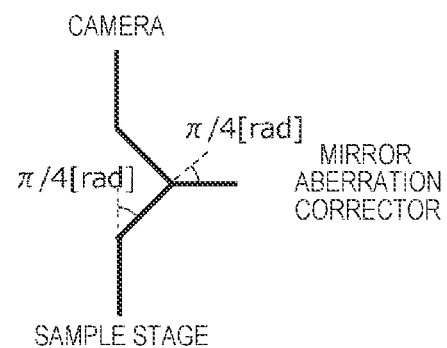
[FIG. 2B]
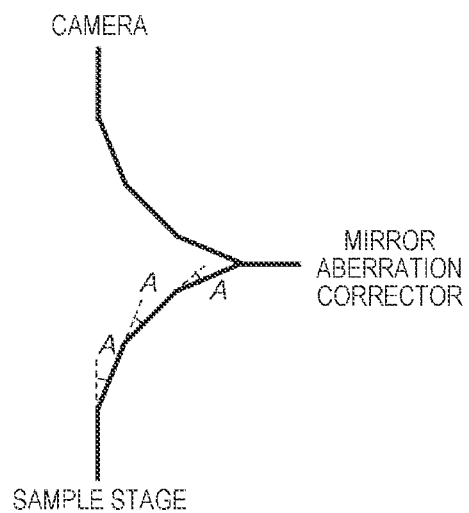

[FIG. 3A]
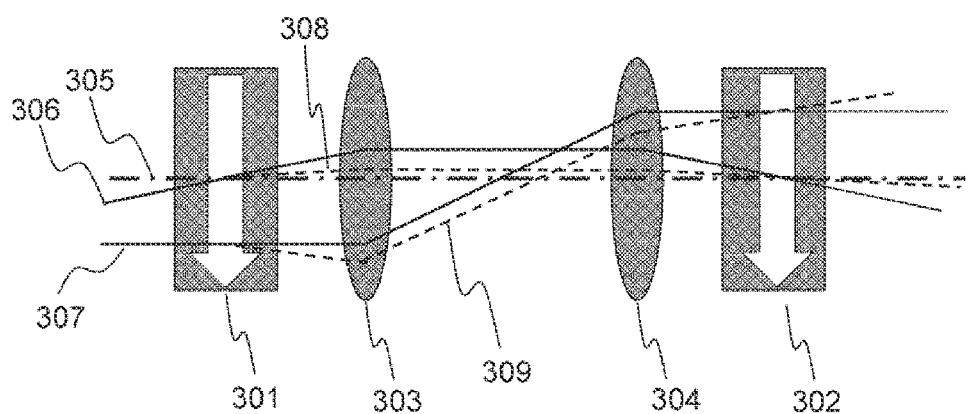
[FIG. 3B]
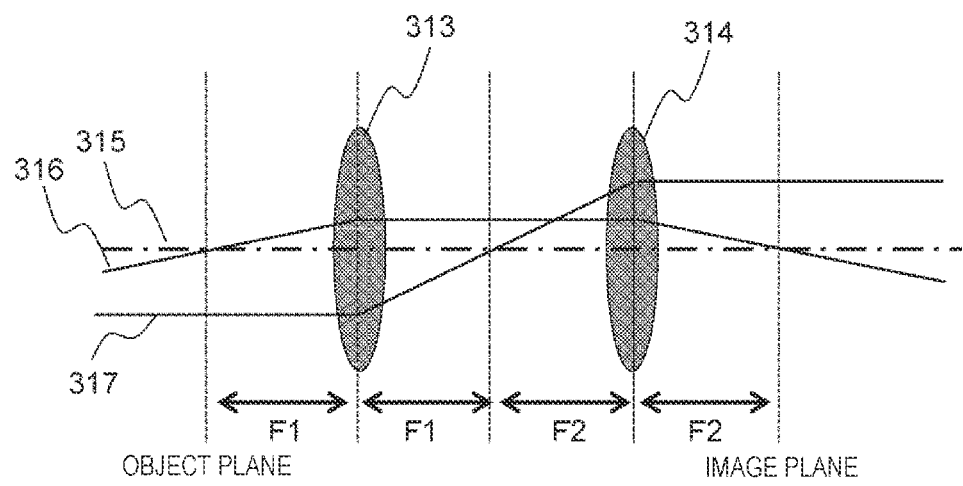

[FIG. 4]
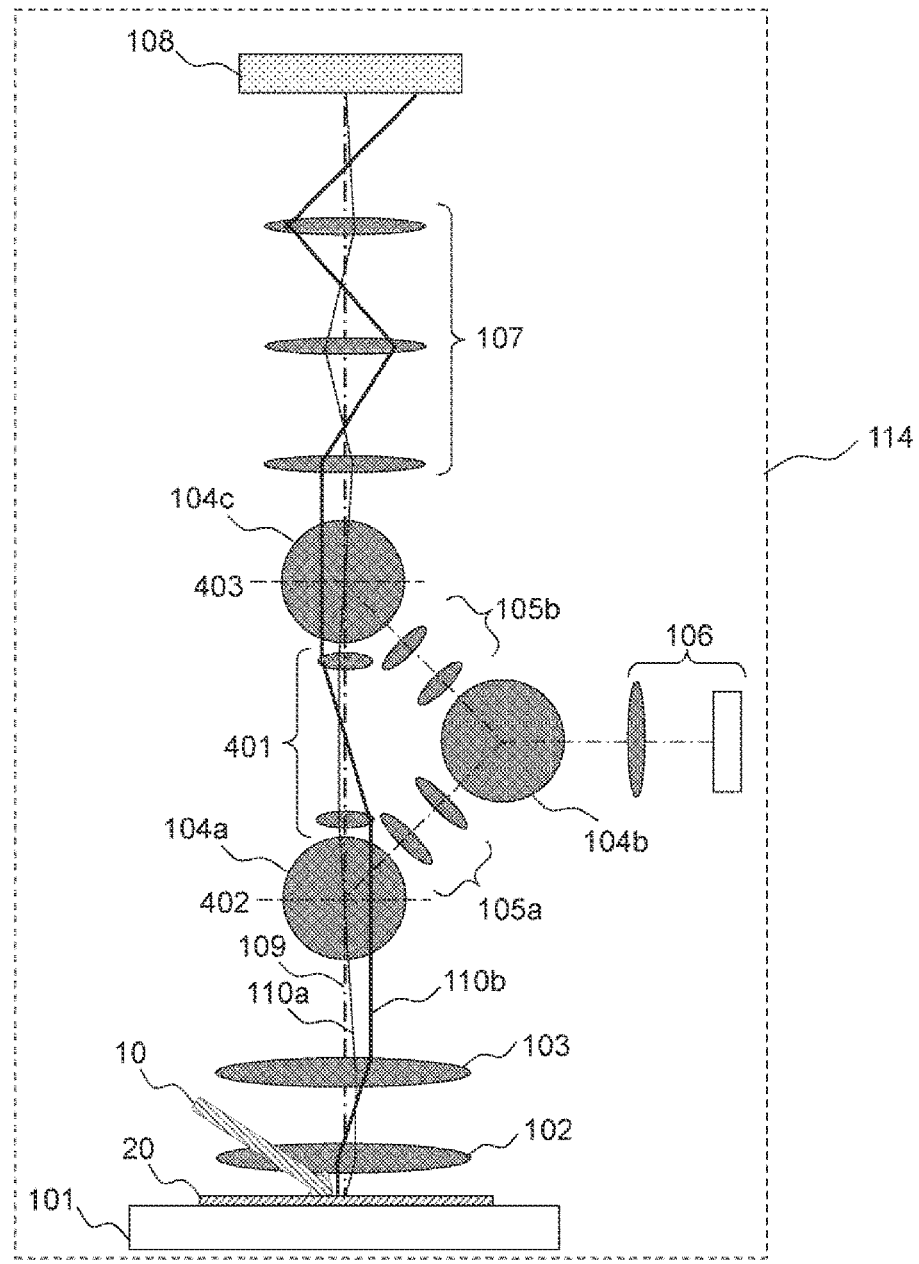

[FIG. 5]
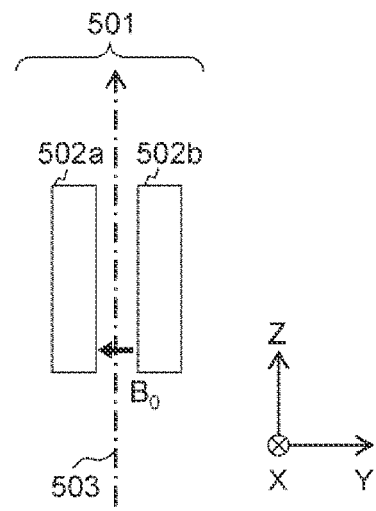
[FIG. 6]
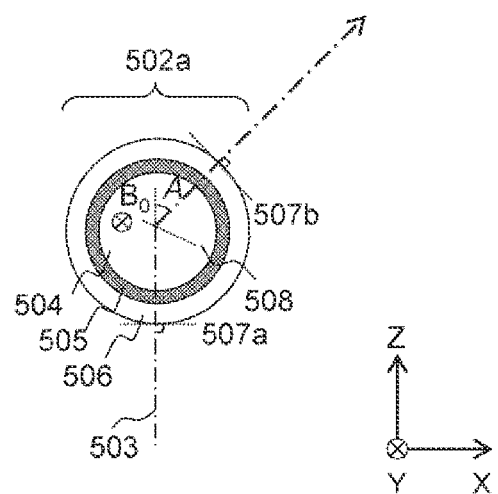

[FIG. 7A]
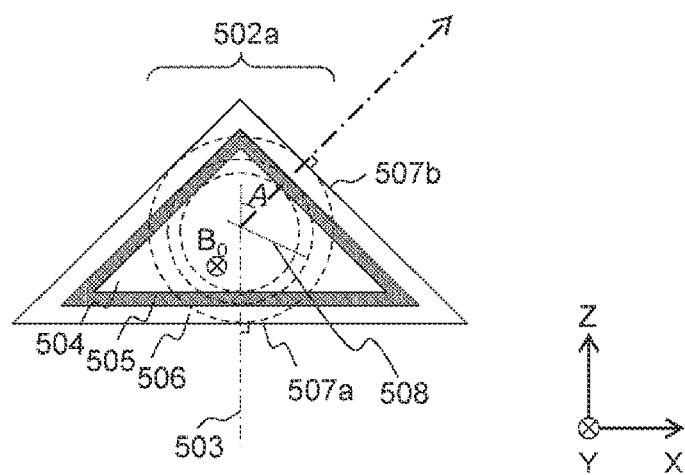
[FIG. 7B]
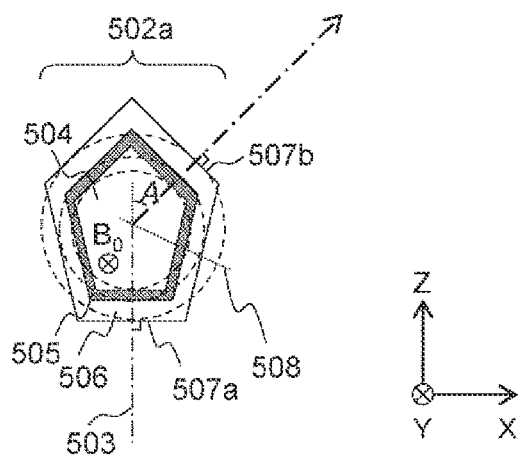

[FIG. 8]
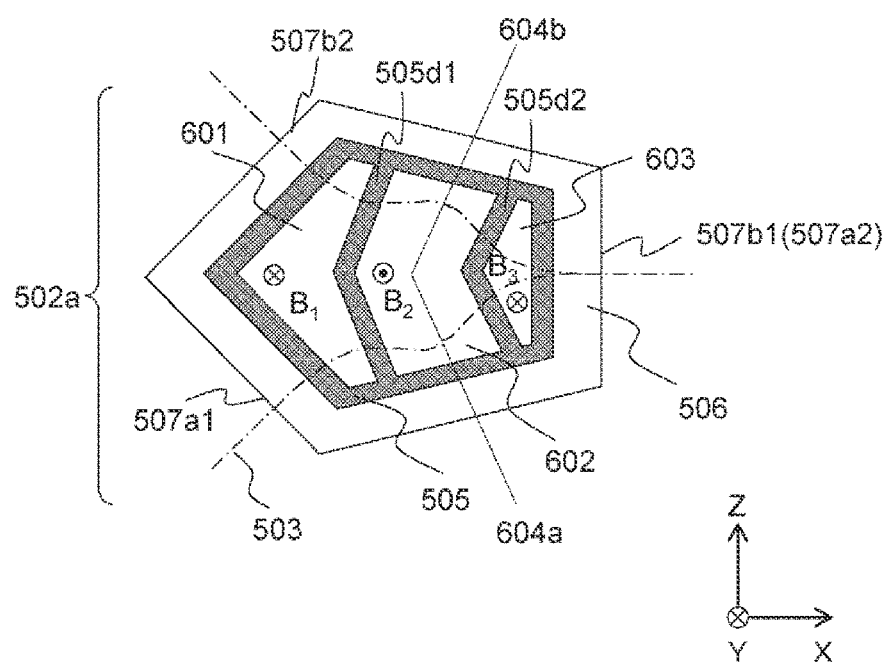

ELECTRON BEAM APPLICATION APPARATUS

CROSS-REFERENCE TO RELATED APPLICATION

This application claims priority to Japanese Patent Application No. 2021-059982 filed on Mar. 31, 2021, the entire contents of which are incorporated by reference herein.

TECHNICAL FIELD

The present invention relates to an electron beam application apparatus.

BACKGROUND ART

A photoelectron emission microscope (PEEM) is an apparatus for forming an image with photoelectrons generated by emitting ultraviolet light or X-rays (excitation light) to a surface of a sample, and a photoelectron image with contrast due to a surface structure of the sample can be obtained.

PTL 1 discloses a structure of a cathode lens microscope (PEEP is one example thereof) having an aberration correction function, and PTL 2 discloses a structure of a TEEM provided with a mirror aberration corrector.

CITATION LIST

Patent Literature

PTL 1: JP-T-2009-528668
PTL 2: JP-A-2020-85873

SUMMARY OF INVENTION

Technical Problem

As an inspection apparatus for a pattern shape formed on a surface of a semiconductor wafer, an optical inspection apparatus using light and a scanning electron microscope (SEM) inspection apparatus using electron beams have been widely used. For the optical inspection apparatus and the SEM inspection apparatus, a size of as observable structure in a sample (semiconductor wafer) is different. The optical inspection apparatus can quickly perform pattern shape inspection on a wide inspection area, but the finer the defect is, the more difficult the detection is. On the other hand, the SEM inspection apparatus has an advantage in detecting fine defects, but an observation field of view is narrow, and when the inspection area is wide, throughput of the pattern shape inspection is reduced.

As an inspection apparatus in which both the throughput of the optical inspection apparatus and the resolution of defect detection of the SEM inspection apparatus can be obtained, an inspection apparatus (PEEP inspection apparatus) for detecting pattern defects on an photoelectron image formed by the PEEP has been studied by the inventors.

In order to use the PEEP inspection apparatus on a semiconductor manufacturing line, it is desired that the PEEM inspection apparatus includes, similarly as the inspection apparatuses currently used in semiconductor manufacturing lines, a horizontal wafer stage on which a sample (semiconductor wafer) is placed horizontally and an electron optical system built in an upright column perpendicular to a wafer mounting surface of the horizontal wafer stage, and handling of semiconductor wafers is aligned with other apparatuses on the semiconductor manufacturing line.

However, in the related-art PEEP or low energy electron microscope (LEEM) which has the same projection imaging system as the PEEM, it is assumed that analysis of small pieces of sample is to be performed, restrictions due to sample handling on the sample stage are reduced, and the stage can be arranged freely. For example, in PTL 1, a path from the sample to a field of view screen on which an image is projected is bent at a right angle by a prism array. Thus, the electron optical system of PTL 1 is not suitable for an a inspection apparatus used in the semiconductor manufacturing line. On the other hand, PTL 2 discloses a photoelectron emission microscope in which an electron optical system, including the mirror aberration corrector, is arranged vertically with respect to a sample plane. However, in the configuration of PTL 2, in order to make a linear optical path in the aberration correction unit, the electron beams are pulsed by intermittent mirroring. In this way, with the electron beams being pulsed, advanced control techniques are required to perform high-precision aberration correction, and the number of electrons reaching the imaging system per unit time decreases, which results in that a time required to obtain a clear photoelectron image becomes longer, and the throughput is decreased.

Solution to Problem

An electron beam application apparatus according to an embodiment of the invention includes a sample stage on which a sample is to be placed; an electron optical system which includes an objective lens for forming an electronic image by electrons emitted from the sample and which has an optical axis perpendicular to a sample mounting surface of the sample stage; and a camera which images the electronic image. The electron optical system includes a mirror aberration corrector disposed perpendicular to the optical axis, a plurality of magnetic field sectors by which an orbit of electrons passing through the objective lens is deviated from the optical axis to make the electrons incident on the mirror aberration corrector, and the orbit of the electrons emitted from the mirror aberration corrector is returned to the optical axis, and a doublet lens disposed between adjacent magnetic field sectors along the orbit of the electrons, the plurality of magnetic field sectors have the same deflection angle for deflecting the orbit of the electrons, and the doublet lens is disposed such that an object plane and an image plane thereof are respectively central planes of the adjacent magnetic field sectors along the orbit of the electrons.

Advantageous Effect

A projection electron beam application apparatus suitable for use in a semiconductor manufacturing line is provided. Other problems and novel characteristics will become apparent from the descriptions of this specification and the accompanying drawings.

BRIEF DESCRIPTION OF DRAWINGS

FIG. 1 is a configuration example of an electron beam application apparatus.
FIG. 2A is a diagram illustrating orbital control of an electron beam performed by a magnetic field sector.
FIG. 2B is a diagram illustrating the orbital control of the electron beam performed by the magnetic field sector.

FIG. 3A is a diagram illustrating a principle of canceling a deflection aberration generated by the magnetic field sector.

FIG. 3B shows a doublet lens.

FIG. 4 is a configuration example (modification) of an electron beam application apparatus.

FIG. 5 is a diagram showing a configuration of the magnetic field sector.

FIG. 6 shows an example of a pole piece.

FIG. 7A shows an example of the pole piece.

FIG. 7B shows an example of the pole piece.

FIG. 8 shows an example of the pole piece.

DESCRIPTION OF EMBODIMENTS

FIG. 1 shows a configuration example of an electron beam application apparatus of the present embodiment. FIG. shows a PEEM in which an image of photoelectrons (photoelectron image) generated by emitting excitation light 10 such as ultraviolet light or X-rays to a surface of a wafer (sample) 20 is obtained. An apparatus main body 114 includes, as a main configuration thereof, a sample stage 101 on which the wafer 20 to be inspected is placed, a camera 108 for imaging the photoelectron image, and an electron optical system for projecting the photoelectron image onto the camera 108. A sample mounting surface of the sample stage 101 is adjusted so as to be horizontal with respect to a floor surface on which the apparatus main body 114 is installed. The camera 108 may directly detect and image electrons (photoelectrons), or may be provided with a scintillator to once convert the electrons into light, and detect and image the converted light.

The apparatus main body 114 (including the sample stage 101, the camera 108, and the electron optical system) is connected to a control device 112. The control device 112 controls the apparatus main body 114 in response to an instruction input from a graphical user interface (GUI) device 111 by a user, and performs image processing of the photoelectron image captured by the camera 108. The control device 112 includes a storage unit 113, and the storage unit 113 stores control parameters of the apparatus main body 114 and the photoelectron image.

An optical axis 109 which is a center of an orbit of the electron beam in the electron optical system of FIG. 1 is perpendicular to the sample mounting surface of the sample stage 101. Thus, the electron optical system and the camera 108 can be built in an upright column, and the handling of the wafer 20 can be aligned with other apparatuses used in a semiconductor manufacturing line. The electron optical system will be described by being divided into three sections A to C. Here, when the sample mounting surface of the sample stage 101 is set as an XY plane and a direction perpendicular to the XY plane is set as a Z direction, the optical axis 109 is shown as a line extending in the Z direction from an incident position of the excitation light 10 with respect to the wafer 20.

In the section A, an objective lens 102 forms a photoelectron image. In FIG. 1, an axial ray before incidence on the mirror aberration corrector 106 is shown as an axial ray 110a, and a field ray before incidence on the mirror aberration corrector 106 is shown as a field ray 110b. The lens 103 is an auxiliary objective lens, and the auxiliary objective lens 103 functions to align the field ray 110b in parallel with the optical axis 109. The photoelectron image is magnified by the objective lens 102 from a distance between the axial ray 110a and the field ray 110b on the wafer 20 to a distance between the axial ray 110a and the field ray 110b (indicated by an arrow) in the magnetic field sector 104a.

In the section B, chromatic aberration and spherical aberration of the photoelectron image is corrected. The mirror aberration corrector 106 is used in correction of the chromatic aberration and the spherical aberration of the photoelectron image. The mirror aberration corrector 106 includes a plurality of electrodes, and reflects an orbit near the electrodes by a voltage applied to a final stage thereof. The spherical aberration and the chromatic aberration can be corrected by controlling the voltage applied to the electrodes. The mirror aberration corrector 106 is, for example, similar to the electronic mirror disclosed in PTL 1, and a known configuration can be used. The mirror aberration corrector 106 is disposed so as to be orthogonal to the optical axis 109. Thus, in the section B, the magnetic field sectors 104a to 104 are used to control the orbit of the photoelectrons such that the orbit of the photoelectrons is deviated from the optical axis 109, the photoelectrons are incident on the mirror aberration corrector 106, and the orbit of the photoelectrons emitted from the mirror aberration corrector 106 is returned to the optical axis 109 again. In FIG. an axial ray after emission from the mirror aberration corrector 106 is shown as an axial ray 110c, and a field ray after emitting from the mirror aberration corrector 106 is shown as a field ray 110d. The magnetic field sector 104a is disposed such that a center of the magnetic field sector is at a position where the axial ray 110a and the optical axis 109 intersect. Similarly, the magnetic field sector 104c is disposed such that a center of the magnetic field sector is at a position where the axial ray 110c and the optical axis 109 intersect. In the section B, a photoelectron image (indicated by an arrow in the magnetic field sector 104c) in which the chromatic aberration and the spherical aberration is corrected is obtained. The magnifications (1×) of the photoelectron images at an inlet (magnetic field sector 104a) and an exit (magnetic field sector 104c) of section. B are not changed.

In the section. C, the aberration-corrected photoelectron image is magnified and projected onto an imaging surface of the camera 108 by a projection lens 107.

Regarding the orbit of the electron beam (photoelectron) in the magnetic field sectors, FIG. 1 shows that the electron beam travels linearly and refracts at an angle at a certain point for ease of understanding, but in reality the electron beam bends smoothly. The same applies to the following drawings.

The orbital control of the photoelectrons (electron beam) in the section B will be described with reference to FIGS. 2A and 2B. In the section. B, it is necessary to bent the travel direction of the electron beam by 90° (π/2) from the optical axis 109 in order to make the electron beam incident on the mirror aberration corrector, and then to bend the travel direction of the electron beam by 90° (π/2) again in order to make the electron beam emitted (reflected) from the mirror aberration corrector to travel along the optical axis 109 again. The magnetic field sectors 104 are used to change the travel direction of the electron beam, and the magnetic field sectors 104 generate a deflection aberration depending on a deflection direction. Thus, in the present embodiment, the electron beam deflected in a first magnetic field sector is incident on a second magnetic field sector, the electron beam is deflected in the second magnetic field sector, and the deflection aberration generated in the first magnetic field sector is canceled. Therefore, absolute values of magnitudes of the deflection aberration generated in the first magnetic field sector and the second magnetic field sector are required to be equal, so that a deflection angle of the first magnetic field sector and a deflection angle of the second magnetic field sector are required to be the same.

It is necessary to cancel deflection aberration of an orbit from the optical axis 109 to incidence on the mirror aberration corrector and deflection aberration of an orbit from the emission from the mirror aberration corrector to the optical axis 109. Thus, even number of magnetic field sectors are required before and after the electron beam is incident on the mirror aberration corrector, and the magnetic field sector (magnetic field sector 104b in FIG. 1) placed immediately before the mirror aberration corrector is used in common before and after the electron beam is incident on the mirror aberration corrector.

The electron optical system in section B (corresponding to FIG. 2A) in FIG. 1 is shown with a configuration in which the number of magnetic field sectors is minimized, and includes three magnetic field sectors as a whole, and each of the magnetic field sectors has a deflection angle of π/4. The configuration of the magnetic field sectors that control the orbit of the electron beam in the section B is generalized and shown in FIG. 2B. Magnetic field sectors are disposed at bending points in FIG. 2B. When the number of magnetic field sectors in the section. B is S, the deflection angle of the magnetic field sector in this case is A, S and A are expressed by the following equations.

$$S=4N-1$$

$$A=\pi/4N [\text{rad}]$$

Here, N is a natural number. FIG. 2A corresponds to a case of N=1, and FIG. 2B corresponds to a case of N=2. When N is a larger number, the number of magnetic field sectors increases, but the deflection aberration generated by the magnetic field sectors can be reduced, so that the orbit of the electron beam can be controlled more accurately.

The deflection aberration Generated in the first magnetic field sector can be canceled by sandwiching a doublet lens 105 between the first magnetic field sector and the second magnetic field sector.

First, the doublet lens will be described with reference to FIG. 3B. The doublet lens includes two lenses, 313 and 314. When focal lengths of the lenses 313 and 314 are respectively F1 and F2, a distance between an object plane and the lens 313 is F1, a distance between the lens 313 and the lens 314 is (F1+F2), and a distance between the lens 314 and a negative image plane is F2. A field ray 317 incident on the lens 313 in parallel with an optical axis 315 from the object plane crosses the optical axis at a position to which a distance from the lens 313 is F1 and to which a distance from the lens 314 is F2, and after passing through the lens 314, the field ray 317 is parallel to the optical axis 315 again. An axial ray 316 that passes through the optical axis 315 at the object plane passes through the optical axis 315 on the image plane. In this way, a feature is shown in which the travel directions of the axial ray 316 and the field ray 317 are reversed with respect to the optical axis 315 before and after the incidence on the doublet lens. With this feature, the deflection aberration generated in the first magnetic field sector is canceled in the second magnetic field sector.

Since the lenses 313 and 314 in the doublet lens used in the present embodiment have the same magnification, the focal length F1=the focal length F2. In a case where the lenses 313 and 314 are magnetic field lens, by reversing positive and negative of the current flowing through the coil, rotation of the orbit of the electron beam is canceled.

FIG. 3A schematically shows orbits of electron beams passing through a doublet lens including a first magnetic field sector 301, a second magnetic field sector 302, and lenses 303 and 304 arranged between the magnetic field sectors 301 and 302. The first magnetic field sector 301 is disposed at the object plane of the doublet lens, and the second magnetic field sector 302 is disposed at the image plane of the doublet lens. In reality, the orbits of the electron beams are deflected by the magnetic field sectors, which is, however, simplified in FIG. 3A, and the orbits of the electron beams are shown to travel straight. Arrows shown in the first magnetic field sector 301 and the second magnetic field sector 302 indicate a direction and magnitude of the deflection. As described above, the direction and magnitude of the deflection of the first magnetic field sector 301 and the second magnetic field sector 302 are the same.

As described in FIG. 1, the axial ray of the photoelectrons (electron beam) intersects the optical axis at the center of the magnetic field sectors. Thus, the center of the magnetic Held sectors is included in the object plane and the image plane of the doublet lens, and thereby, as shown in FIG. 3A, in a state where there is no deflection aberration, the axial ray 306 intersects the optical axis 305 at the center of the first magnetic field sector 301 and intersects the optical axis 305 again at the center of the second magnetic field sector 302. The field ray 307 is incident on the lens 303 in an orbit parallel to the optical axis 305, and is emitted from the lens 304 in an orbit parallel to the optical axis 305.

Due to the deflection aberration generated in the first magnetic field sector 301, the axial ray 306 is changed into a deflection axial ray 308, and the field ray 307 is changed into a deflection field ray 309. In this example, the deflection axial ray 308 and the deflection field ray 309 are incident on the lens 303 below the axial ray 306 and the field ray 307 when viewed on the paper, respectively. As described in FIG. 3B, since the orbits of the electron beams with respect to the optical axis are reversed before and after the incidence on the doublet lens, in a state where the second magnetic field sector 302 does not generate the deflection aberration, the deflection axial ray 308 and the deflection field ray 309 that pass through the second magnetic field sector 302 pass above the axial ray 306 and the field ray 307 respectively, when viewed on the paper. Thus, since the second magnetic field sector 302 generates the same deflection aberration as the first magnetic field sector 301, the deflection axial ray 308 and the deflection field ray 309 that pass through the second magnetic field sector 302 are returned to the ax al ray 306 and the field ray 307, respectively. That is, the deflection aberration has been canceled.

In a case where it is difficult to configure, by a single-stage doublet lens, a correlation between a distance from the first magnetic field sector 301 to the second magnetic field sector 302 and focal lengths of the lenses 303 and 304 constituting the doublet lens, doublet lenses with odd-numbered stages may be disposed between the magnetic field sectors. Thus, when the number of lenses disposed between adjacent magnetic field sectors is L, L is expressed by the following equation.

$$L=2(2M-1)$$

Here, M is a natural number. In FIG. 1, a doublet lens 105a between the magnetic field sector 104a and the magnetic field sector 104b and a doublet lens 105b between the magnetic field sector 104b and the magnetic field sector 104c are both examples (L=2) of the single-stage doublet lens. The number of stages of the doublet lens may be different for each position between the magnetic field sectors.

FIG. 4 shows a modification of the apparatus main body 114. In this modification, magnetic field sectors can be temporarily turned off in a case where high resolution is not required or in a case where the apparatus main body is to be adjusted. A configuration is basically the same as that in FIG. 1, but a lens group 401 is disposed between the magnetic field sector 104a closest to the position of a sample and the magnetic field sector 104c closest to a camera. In an aberration correction OFF mode, the axial ray 110a and the field ray 110b travel straight without being deflected by the magnetic field sectors 104 because the magnetic field sectors 104a to 104c are turned off with no current pass therethrough. The lens group 401 projects a central surface 402 of the magnetic field sector 104a onto a central surface 403 of the magnetic field sector 104c at 1× magnification. By projecting at 1× magnification, the magnification of the electron optical systems can be made constant regardless of ON/OFF of the magnetic field sectors (aberration correction ON mode/aberration correction OFF mode). Accordingly, an off-axis distance when the axial ray and the field ray pass through the projection lens 107 can be the same regardless of the aberration correction ON mode/aberration correction OFF mode, so that it is also possible to align aberration generated by the projection lens 107, an orbit selection based on an aperture, and aligner sensitivity. For example, by configuring the lens group 401 with a doublet lenses of one or more stages and making focal lengths of lenses in the lens group 401 equal, the lens group 401 that projects at 1× magnification can be implemented.

A configuration of the magnetic field sector used in the present embodiment will be described. FIG. 5 shows a magnetic field sector 501 as seen from an X direction. The XYZ directions are the same as those in FIG. 1, and the direction in which the electron beam is deflected by the magnetic field sector 501 is included in an XZ plane. The optical axis 503, which is the center of the orbit of the electron beam, is also shown. The magnetic field sector 501 includes two planar pole pieces 502a and 502b facing each other with the optical axis 503 sandwiched therebetween. The pole pieces 502a and 502b are arranged in parallel with the XZ plane. The pole pieces 502a and 502b have the same shape. FIG. 6 shows the pole piece 502a seen in the Y direction from the optical axis.

FIG. 6 shows an example of a magnetic field sector having a circular planar shape. The pole piece 502 is made of a magnetic material such as iron. A groove 505 which is concentric with the pole piece 502 is formed in the pole piece 502, an inside of the groove 505 is referred to as a main pole piece 504, and an outside of the groove 505 is referred to as a shield magnetic pole 506. A coil is wound around the groove 505, and by controlling a direction and an amount of current flowing through the pole piece coils facing each other the same, a uniform magnetic field B0 between the main pole piece 504 of the pole piece 502a and the main pole piece 504 of the pole piece 502b is generated. The magnetic field B0 is terminated at the shield magnetic pole 506, and the magnetic field is not present outside the magnetic field sector.

An electron beam is deflected in the X direction by a Lorentz force. An electron beam incidence plane 507a and an electron beam emission plane 507b of the magnetic field sector are perpendicular to the optical axis. A deflection angle A of the magnetic field sector in the present embodiment is π/4N [rad] (N=1 in FIG. 6) as described above, and the electron beam emission plane 507b is defined according to the deflection angle A of the magnetic field sector.

A central plane 508 is a plane including a line of intersection between the electron beam incidence plane 507a and the electron beam emission plane 507b and a center of the pole piece 502a, A distance inside the main pole piece, a distance of the groove, and a distance of the shield magnetic pole of the optical axis 503 are the same about the central plane 508, and the orbit of the electron beam is symmetrical with the central plane 508 as a starting point. As shown in FIG. 3A, since the axial ray of the electron beam intersects the optical axis at the center of the magnetic field sector, the deflection aberrations generated in the magnetic field sectors cancel each other out with the central plane 508 as a boundary.

The planar shape of the magnetic field sector may not be a circular shape, and the same effect can be obtained by maintaining conditions such as symmetry and verticality described in FIG. 6. Examples of such a case are shown in FIGS. 7A and 7B. Dotted lines in each of the FIGS. 7A and 7B show the shape (corresponding to FIG. 6) when the plane shape of the pole piece is a circular shape, which can deflect the same electron beam. Thus, on the optical axis 503, arrangement of the main pole piece 504, the groove 505, and the shield magnetic pole 506 is the same as that in FIG. 6, further, the electron beam incidence plane 507a and the electron beam emission plane 507b are end surfaces of the pole piece 502 in both the structures of FIGS. 7A and 7B, and thereby the structures of FIGS. 7A and 7B are structures more advantageous than the structure shown in FIG. 6 in that the deflection aberration is less likely to occur. FIG. 7B shows a structure in which a structure portion through which the electron beam does not pass is further cut from the structure of FIG. 7A, which has an advantage that a space of the column in which the electron optical system is built can be effectively utilized.

FIG. 8 shows another configuration example of the magnetic field sector. Since the Lorentz force does not act on the electron beam traveling in a direction parallel to the magnetic field B0, the electron beam is basically focused only in the deflection direction in the magnetic field sector. Thus, the electron beam is in a state where astigmatism is greatly generated. FIG. 8 shows a configuration that prevents the generation of astigmatism due to the magnetic field sector. A fringe field (magnetic field) near the groove 505 of the pole piece has a magnetic field component horizontal with respect to the deflection direction of the electron beam, and thus can act in a direction perpendicular to the deflection direction of the electron beam. Therefore, in the magnetic field sector of FIG. 6, the generation of astigmatism is prevented by utilizing the fringe field.

In the electron optical system shown in FIG. 1, since the electron beam is incident on and emitted from twice the magnetic field sector 104b closest to the mirror aberration corrector 106, the strictest control of the electron beam is required. Accordingly, FIG. 8 shows a pole piece in which a structure for astigmatism prevention is added to the pole piece shown in FIG. 7B. In order to make it easier co understand the association with the magnetic field sector 104b in FIG. 1, the pole piece in FIG. 7B is rotated by 90° to the left and shown in FIG. 8.

In the configuration of FIG. 8, a main pole piece is separated into three main pole pieces 601 to 603 by grooves. An intermediate plane 604a is an intermediate plane with respect to an electron beam incidence plane 507a1 and an electron beam emission plane 507b1, an intermediate plane 604b is an intermediate plane with respect to an electron beam incidence plane 507a2 (the same as the electron beam emission plane 507b1) and an electron beam emission plane 507b2. The grooves 505d1 and 505d2 that separate the main pole pieces are formed to be, parallel to the intermediate planes 604a and 604b.

In this example, the same current flows in the coils of the first and third main pole pieces to make a magnetic field B1 generated by the first main pole piece 601 the same as a magnetic field B3 generated by the third main pole piece 603, a different current flows in a coil of the second main pole piece 602 to make a magnetic field B2 Generated by the second main pole piece 602 opposite to that of the magnetic field B1 (B3). As long as the optical axis passing through the corresponding electron beam incidence plane and electron beam emission plane is maintained symmetric with respect to the intermediate plane 604a or the intermediate plane 604b, it is possible to freely select the magnetic fields B1 (B3) and B2. In the example of FIG. 8, the magnetic field B2 is reversed with respect to the magnetic fields B1 and B3, and thereby an orbit in which the optical axis bulges outward is formed. If all the currents flowing through the first to third main pole pieces are the same, the orbits of the deflected electron beams are the same as in the case of the pole piece of FIG. 7B, Since the fringe magnetic field received when the electron beam passes through the grooves 505 (including the grooves 505d that separate the main pole piece) changes depending on a combination of the magnetic fields B1 to B3, a combination of the magnetic fields B1 to B3 that minimizes an amount of generated astigmatism may be selected. FIG. 8 shows an example in which the main pole piece is divided into three parts, and the main pole piece may be further divided into more parts. For example, since it is difficult to wind the coil along a dented main pole piece from the view point of mounting, the first main pole piece 601 or the second main pole piece 602 is divided into upper and lower parts, coils are wound for the parts, and the same current flows through the coils, which can obtain the same effects.

Although the invention has been described above according to the embodiments, the invention is not limited to the above-described contents. For example, although the SEEM has been described as an example in the present embodiment, the electron optical system of the present embodiment can be applied to an LEEM having a similar electron optical system.

REFERENCE SIGN LIST

10: excitation light
20: wafer (sample)
101: sample stage
102: objective lens
103: auxiliary objective lens
104: magnetic field sector
105: doublet lens
106: mirror aberration corrector
107: projection lens
108: camera
109: optical axis
110a, 110c: axial ray
110b, 110d: field ray
111: GUI device
112: control device
113: storage device
114: apparatus main body
301, 302: magnetic field sector
303, 304, 313, 314: lens
305, 315: optical axis
306, 308, 316: axial ray
307, 309, 317: field ray
401: lens group
402, 403: central surface
501: magnetic field sector
502: pole piece
503: optical axis
504: main pole piece
505: groove
506: shield magnetic pole
507a: electron beam incidence plane
507b: electron beam emission plane
508: central plane
601: first main pole piece
602: second main pole piece
603: third main pole piece
604: central plane

The invention claimed is:

1. An electron beam application apparatus, comprising,
a sample stage on which a sample is to be placed;
an electron optical system which includes an objective lens for forming an electronic image by electrons emitted from the sample and which has an optical axis perpendicular to a sample mounting surface of the sample stage; and
a camera which images the electronic image; wherein
the electron optical system includes
a mirror aberration corrector disposed perpendicular to the optical axis;
a plurality of magnetic field sectors by which an orbit of electrons passing through the objective lens is deviated from the optical axis to make the electrons incident on the mirror aberration corrector, and the orbit of the electrons emitted from the mirror aberration corrector is returned to the optical axis; and
a doublet lens disposed between adjacent magnetic field sectors along the orbit of the electrons,
each of the plurality of magnetic field sectors has a same deflection angle for deflecting the orbit of the electrons, and
the doublet lens is disposed such that an object plane and an image plane thereof are respectively central planes of the adjacent magnetic field sectors along the orbit of the electrons.

2. The electron beam application apparatus according to claim 1, wherein
when the number of the plurality of magnetic field sectors in the electron optical system is S and the deflection angles of the plurality of magnetic field sectors are A, S and A are expressed by the following equations:

$$S=4N-1$$

$$A=\pi/4N[\text{rad}]$$

wherein N is a natural number.

3. The electron beam application apparatus according to claim 1, wherein
the central plane of each said magnetic field sector is a plane including a line of intersection between an electron beam incidence plane and an electron beam emission plane of the magnetic field sector and a center of the magnetic field sector.

4. The electron beam application apparatus according to claim 1, wherein the plurality of magnetic field sectors include a first magnetic field sector and a second magnetic field sector whose centers are disposed on the optical axis, the center of the first magnetic field sector is disposed at an intersection between an axial ray of the electrons passing through the objective lens and the optical axis, and the center of the second magnetic field sector is disposed at an intersection between an axial ray of the electrons emitted from the mirror aberration corrector and the optical axis.

5. The electron beam application apparatus according to claim 4, wherein the electron optical system includes an auxiliary objective lens, by which a field ray of the electrons passing through the objective lens is aligned in parallel with the optical axis, between the objective lens and the first magnetic field sector; and a projection lens which magnifies and projects an electronic image, that is aberration-corrected by the mirror aberration corrector, onto an imaging surface of the camera.

6. The electron beam application apparatus according to claim 4, wherein the doublet lens of one stage or a plurality of stages is disposed between the first magnetic field sector and the second magnetic field sector, and the plurality of magnetic field sectors are able to be turned off.

7. The electron beam application apparatus according to claim 6, wherein an electronic image is formed on the second magnetic field sector at the same magnification as an electron image formed on the first magnetic field sector regardless of whether the plurality of magnetic field sectors are turned on or off.

8. The electron beam application apparatus according to claim 1, wherein the magnetic field sectors include planar pole pieces facing each other with the optical axis sandwiched therebetween, the pole piece is separated into a main pole piece and a shield magnetic pole by a first groove, the first groove is formed so as to surround the main pole piece, and a coil that generates a magnetic field in the magnetic field sector is disposed in the first groove.

9. The electron beam application apparatus according to claim 8, wherein a planar shape of the pole piece is a circular shape, and the first groove is formed concentrically with the pole piece.

10. The electron beam application apparatus according to claim 8, wherein a first end surface of the pole piece is an electron beam incidence plane of the magnetic field sector, a second end surface of the pole piece is an electron beam emission plane of the magnetic field sector, and in the optical axis from the electron beam incidence plane to a center and the optical axis from the center to the electron beam emission plane in the magnetic field sector, arrangement of the main pole piece, the first groove, and the shield magnetic pole is the same.

11. The electron beam application apparatus according to claim 8, wherein a second groove is formed to further separate the main pole piece into a plurality of main pole pieces, a coil that generates a magnetic field in the magnetic field sector is disposed in each of the first groove and the second groove, and the second groove is formed to be parallel to the central plane of the magnetic field sector.

12. The electron beam application apparatus according to claim 11, wherein a different magnetic field is generated for each of the plurality of separated main pole pieces.

13. The electron beam application apparatus according to claim 11, wherein the central plane of the magnetic field sector is a plane including a line of intersection between an electron beam incidence plane and an electron beam emission plane of the magnetic field sector and a center of the magnetic field sector.

14. The electron beam application apparatus according to claim 1, wherein a sample mounting surface of the sample stage is adjusted so as to be horizontal with respect to a floor surface on which the electron beam application apparatus is installed.

\* \* \* \* \*